(12) United States Patent
Zhou

(10) Patent No.: US 12,711,879 B2
(45) Date of Patent: Aug. 18, 2026

(54) FLEXIBLE DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Wenjun Zhou, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 947 days.

(21) Appl. No.: 17/289,002

(22) PCT Filed: Apr. 22, 2021

(86) PCT No.: PCT/CN2021/088939

§ 371 (c)(1),
(2) Date: Oct. 13, 2022

(87) PCT Pub. No.: WO2022/213426

PCT Pub. Date: Oct. 13, 2022

(65) Prior Publication Data

US 2024/0013685 A1 Jan. 11, 2024

(30) Foreign Application Priority Data

Apr. 9, 2021 (CN) ........................ 202110385251.6

(51) Int. Cl.
*G09F 9/30* (2006.01)
*H10K 50/842* (2023.01)
(Continued)

(52) U.S. Cl.
CPC ......... *G09F 9/301* (2013.01); *H10K 50/8426* (2023.02); *G06F 1/1652* (2013.01); *H10K 50/84* (2023.02); *H10W 90/00* (2026.01)

(58) Field of Classification Search
CPC . G09F 9/301; G06F 1/11652; H10K 50/8426; H10K 50/84; H01L 25/167
(Continued)

(56) References Cited

U.S. PATENT DOCUMENTS

2017/0047547 A1* 2/2017 Son ...................... H10K 50/844
2018/0182829 A1* 6/2018 Shin ...................... G06F 1/1652
2018/0217640 A1 8/2018 Nishikawa

FOREIGN PATENT DOCUMENTS

CN 106816530 A 6/2017
CN 106847871 A 6/2017
(Continued)

*Primary Examiner* — Ruiyun Zhang

(57) ABSTRACT

A flexible display panel and a display device are provided. A first adhesive layer and a second adhesive layer are provided on a surface of a light-emitting side of the display panel. The first adhesive layer covers a bendable portion and extends toward a direction of the display area, and the second adhesive layer is located on a side of the first adhesive layer away from the display area and connected to the first adhesive layer. The flexible display panel and the display device proposed in the present application can relieve a problem of cracks on both sides of a non-display area and improve product reliability.

17 Claims, 3 Drawing Sheets

(51) Int. Cl.

| | |
|---|---|
| *G06F 1/16* | (2006.01) |
| *H10K 50/84* | (2023.01) |
| *H10W 90/00* | (2026.01) |

(58) Field of Classification Search
USPC .......................................................... 428/1.1
See application file for complete search history.

(56) References Cited

FOREIGN PATENT DOCUMENTS

| | | | |
|---|---|---|---|
| CN | 110224081 | A | 9/2019 |
| CN | 110491883 | A | 11/2019 |
| CN | 110517590 | A | 11/2019 |
| CN | 111599272 | A | 8/2020 |
| CN | 111933611 | A | 11/2020 |
| CN | 112071203 | A | 12/2020 |
| CN | 212256768 | U | 12/2020 |
| KR | 20190037600 | A | 4/2019 |

* cited by examiner

FLEXIBLE DISPLAY PANEL AND DISPLAY DEVICE

FIELD OF INVENTION

The present application relates to the field of display technology, and in particular to a flexible display panel and a display device.

BACKGROUND OF INVENTION

In contemporary communications industry, market demand for various mobile terminal devices is increasing. At a same time, display screens of the various mobile terminal devices are also developing in a direction of large size and dynamic bending.

Generally, a non-display area is provided at a bottom of a display panel, and a process of bending the non-display area to a back of the display panel is called a non-display area bending (pad bending) process.

FIG. 1 is a schematic plan view of a non-display area of a conventional display panel. FIG. 2 is a schematic diagram of a bending state of the non-display area shown in FIG. 1. As shown in FIG. 1 and FIG. 2, the non-display area 91 includes a bonding area 911 and a wiring area.

In a current non-display area bending process, a length L1 of the non-display area 91 that needs to be correspondingly bent is designed to be longer; however, a length L2 of a bonding area 911 subjected to a force has not changed much. As a result, both sides of the non-display area 91 cannot move synchronously with a middle area during a bending process and cause local stress concentration, so wiring or circuits in the non-display area are easily cracked, resulting in low reliability of the display panel or display device.

Therefore, it is urgent to provide a flexible display panel and a display device to solve the above technical problems.

Technical Problem

In order to solve the above technical problems, the flexible display panel and the display device described in the present application directly apply a first adhesive layer to an edge of the second adhesive layer. In this way, the stiffness of the non-display area and a protective effect on the non-display area can be improved so that the problem of cracking on both sides of the non-display area can be solved. Therefore, the reliability of the products is improved.

SUMMARY OF INVENTION

The present application provides a flexible display panel, including a display area and a non-display area located at a periphery of the display area, wherein the non-display area includes a bendable portion, and wherein a polarizing layer, a first adhesive layer, and a second adhesive layer are provided on a surface of a light-emitting side of the display panel; wherein the polarizing layer at least covers the display area, a predetermined distance between the polarizing layer and the bendable portion is provided along a direction from the display area toward the non-display area, and the predetermined distance is greater than or equal to 550 um; and wherein the first adhesive layer is connected to the polarizing layer and extends in a direction away from the display area, the first adhesive layer covers the bendable portion, and the second adhesive layer is connected to the first adhesive layer and extends in the direction away from the display area.

In some embodiments of the present application, further including a backplate provided on a surface of a non-light emitting side of the display panel, wherein the backplate is provided with a hollow area, and the hollow area exposes the bendable portion.

In some embodiments of the present application, an orthographic projection of the hollow area on the display panel falls within the first adhesive layer.

In some embodiments of the present application, along the direction from the display area toward the non-display area, a distance between the hollow area and the polarizing layer is defined as the predetermined distance.

In some embodiments of the present application, at least one driving chip is bonded to a surface of the light-emitting side of the display panel, and the driving chip is located on a side of the second adhesive layer away from the display area.

The present application further provides another flexible display panel, including a display area and a non-display area located at a periphery of the display area, wherein the non-display area includes a bendable portion, wherein a first adhesive layer and a second adhesive layer are provided on a surface of a light-emitting side of the display panel, and wherein the first adhesive layer and the second adhesive layer are both located in the non-display area; wherein the first adhesive layer covers the bendable portion and extends along a direction from the bendable portion toward the display area; and wherein the second adhesive layer is located on a side of the first adhesive layer away from the display area and connected to the first adhesive layer.

In some embodiments of the present application, further including a polarizing layer provided on the surface of the light-emitting side of the display panel, wherein the polarizing layer at least covers the display area and is connected to the second adhesive layer.

In some embodiments of the present application, the first adhesive layer extends for a predetermined distance along a direction from the bendable portion toward the display area, and the predetermined distance is greater than or equal to 550 um.

In some embodiments of the present application, further including a backplate provided on a surface of a non-light emitting side of the display panel, wherein the backplate is provided with a hollow area, and the hollow area exposes the bendable portion.

In some embodiments of the present application, an orthographic projection of the hollow area on the display panel falls within the first adhesive layer.

In some embodiments of the present application, along the direction from the display area toward the non-display area, a distance between the hollow area and the polarizing layer is defined as the predetermined distance.

In some embodiments of the present application, at least one driving chip is bonded to a surface of the light-emitting side of the display panel, and the driving chip is located on a side of the second adhesive layer away from the display area.

The present application further provides a display device, and the display device includes a flexible display panel. The flexible display panel includes a display area and a non-display area located at a periphery of the display area, wherein the non-display area includes a bendable portion, wherein a first adhesive layer and a second adhesive layer are provided on a light-emitting side of the display panel, and wherein the first adhesive layer and the second adhesive layer are both located in the non-display area; wherein the first adhesive layer covers the bendable portion and extends along a direction from the bendable portion toward the display area, and wherein the second adhesive layer is located on a side of the first adhesive layer away from the display area and connected to the first adhesive layer.

In some embodiments of the present application, the display device further includes a cover plate, the cover plate is provided on a side of the polarizing layer away from the display panel, and the cover plate covers at least the display area of the display panel.

In some embodiments of the present application, the display device further includes a supporting backplate disposed on a non-light emitting side of the display panel and covers at least the display area of the display panel.

In some embodiments of the present application, when the non-display area is bent to the non-light emitting side of the display panel by the bendable portion, the supporting backplate is disposed between a first backplate and a second backplate.

In some embodiments of the present application, the display device further includes a filling gasket disposed on a side of the supporting backplate away from the display panel.

The flexible display panel and the display device having the flexible display panel of the present application improve the stiffness of a non-display area by directly applying a first adhesive layer to an edge of a second adhesive layer. It also enhances a protective effect on the non-display area, which can relieve the problem of cracks on both sides of the non-display area and improve product reliability. By extending the first adhesive layer toward a direction of the display area, and even bonding the first adhesive layer with a polarizing layer, the stiffness of the non-display area can be further improved, and a protective effect on the wiring or circuit on the non-display area can be improved. By arranging a backplate on a non-light emitting side of the display panel, a protective effect on the display area and the stiffness of the non-display area can be further improved without affecting the bending performance of the bendable portion, and thereby improving product reliability.

DESCRIPTION OF DRAWINGS

With reference to the accompanying drawings and detailed description of the specific implementations of the present application, the technical solutions and other beneficial effects of the present application will be clearly understood.

DETAILED DESCRIPTION OF PREFERRED EMBODIMENTS

Figure 1:
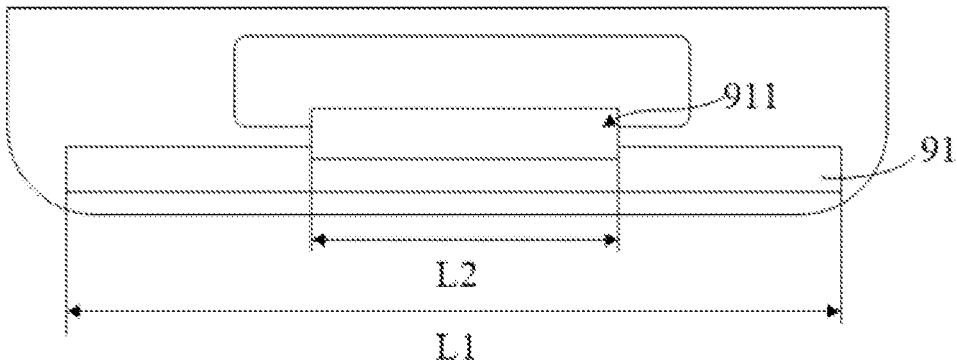
FIG. 1 is a schematic plan view of a conventional display panel.
Figure 2:
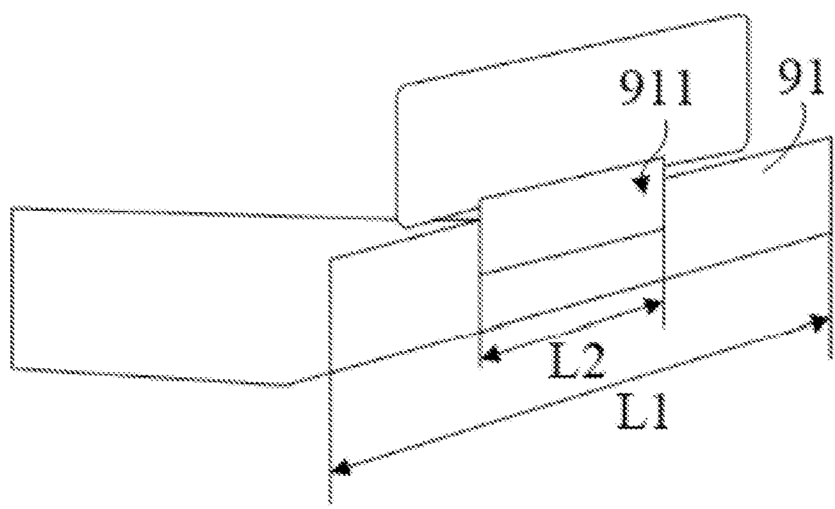
FIG. 2 is a schematic diagram of a bending state of the display panel shown in FIG. 1.

The technical solutions in the embodiments of the present application will be clearly and completely described below with reference to the drawings in the embodiments of the present application. Obviously, the embodiments are only a part of the embodiments of the present application, rather than all the embodiments. Based on the embodiments in this application, all other embodiments obtained by those skilled in the art without doing creative work fall within the protection scope of this application.

Following disclosure provides various embodiments or examples for realizing various structures of the present application. In order to simplify the disclosure of the present application, the components and arrangements of specific examples will be described below. Certainly, they are only examples and are not intended to limit this application. In addition, reference numerals and/or reference letters in different examples may be repeated in this application. This repetition is for the purpose of simplification and clarity and does not indicate the relationship between the various embodiments and/or arrangements discussed. In addition, this application provides examples of various specific processes and materials. However, those of ordinary skill in the art can be aware of the application of other processes and/or the use of other materials.

Figure 3:
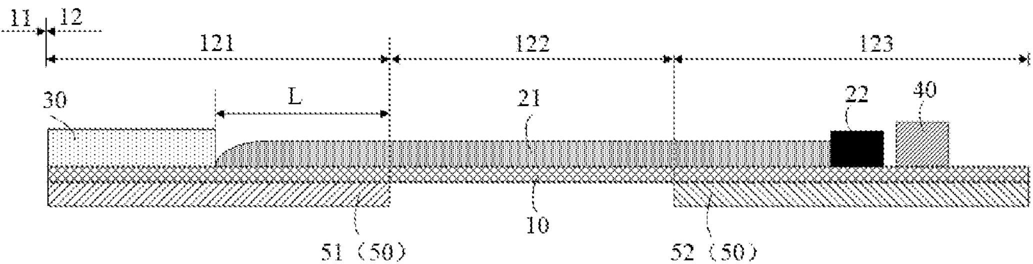
FIG. 3 is a schematic diagram of an unfolded state of a non-display area of a flexible display panel described in this application.
Figure 4:
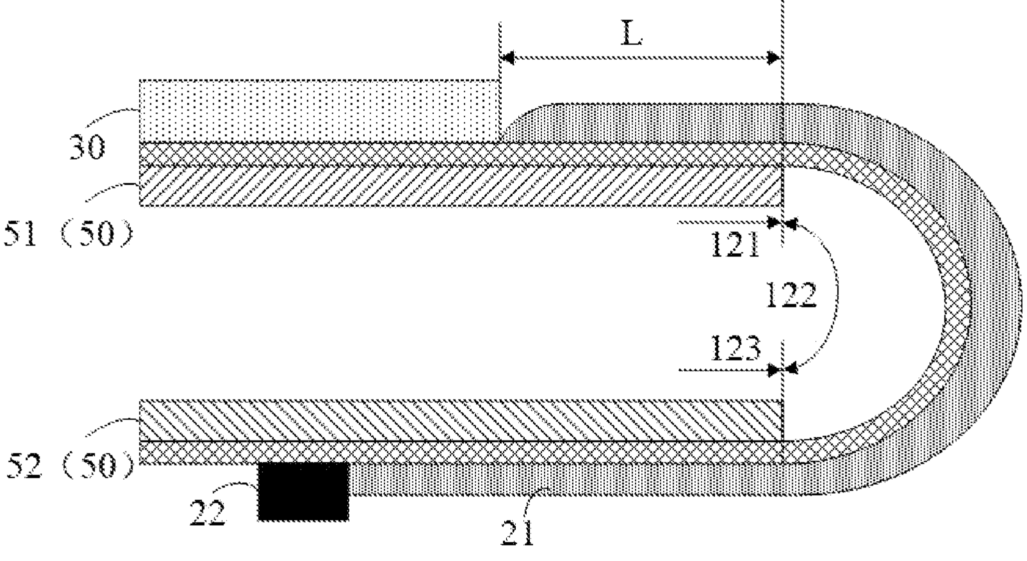
FIG. 4 is a schematic diagram of a bending state of the non-display area of the flexible display panel according to the present application.

FIG. 3 is a schematic diagram of an unfolded state of a non-display area of a flexible display panel described in this application. FIG. 4 is a schematic diagram of a bending state of the non-display area of the flexible display panel described in this application. As shown in FIG. 3 and FIG. 4, the present application provides a flexible display panel 10. The flexible display panel 10 includes a display area 11 and a non-display area 12 located at a periphery of the display area 11, wherein the non-display area 12 includes a first extension portion 121, a bendable portion 122, and a second extension portion 123 that are sequentially connected in a direction away from the display area 11.

In the flexible display device of the present application, a first adhesive layer 21 and a second adhesive layer 22 are disposed on a surface of a light-emitting side of the display panel 10, and the first adhesive layer 21 and the second adhesive layer 22 are connected. This can increase the stiffness on both sides of the non-display area 12 so that the stress concentration points caused by local rebound during a bending process will not be formed on the non-display area 12. In addition, the protection of terminal circuits or wiring in the non-display area 12 can be strengthened, and the problem of cracks on both sides of the non-display area 12 can be relieved, thereby improving product reliability.

Specifically, the display area 11 can display a picture, and the displayed picture can be actually viewed by the user.

The type of the display panel 10 is not limited herein. It can be a liquid crystal display (LCD), or an organic light-emitting diode (OLED). It can also be a quantum dot light-emitting diodes (QLED) display panel. The number of non-display areas 12 is also not limited herein. In order to reduce the frame of the flexible display panel 10 to a greater extent, generally, the display panel 10 only needs to provide one non-display area 12 to meet the requirement.

As shown in FIG. 3 and FIG. 4, the first adhesive layer 21 is disposed on a surface of a light-emitting side of the display panel 10. The first adhesive layer 21 is disposed in the non-display area 12. The first adhesive layer 21 covers the bendable portion 122 and extends along a direction from the bendable portion 122 toward the display area 12. In other words, the first adhesive layer 21 covers the bendable portion 122 and a portion of the first extension portion 121 away from the display area 11.

In a preferred embodiment, the first adhesive layer 21 covers the bendable portion 122 and extends from the bendable portion 122 into the first extension portion 121 and the second extension portion 123.

Specifically, the first adhesive layer 21 extends for a predetermined distance L along a direction from the bendable portion 122 toward the display area 11, and the predetermined distance L is greater than or equal to 550 um, that is, L≥550 um. In this situation, the first adhesive layer 21 is closer to the display area 11, which can more effectively protect circuits or metal wiring at the first extension portion 121 and the bendable portion 122.

Specifically, the first adhesive layer 21 has a width extending direction parallel to a bending axis of the bendable portion 122. By adjusting an extension range (or extension width) of the second adhesive layer 22 in the width extension direction, the stiffness of the non-display area 12 in the direction parallel to the bending axis is further improved. In a specific implementation, the second adhesive layer 22 may have different extension widths or may have the same extension width in a direction from the display area 11 to the non-display area 12.

In a specific implementation, the first adhesive layer 21 can be UV adhesive. The UV adhesive can be, but not limited to, polyurethane or acrylic resin.

It should be emphasized that the present application does not limit the structure, size, thickness, extension manner, and material of the first adhesive layer 21. For example, in a specific implementation, the first adhesive layer 21 can be arranged in a continuous extension manner or may be arranged in a fracture extension manner. For another example, an opening structure, a hole structure, or a groove structure can also be provided in a partial area of the first adhesive layer 21 to relieve bending stress of the first adhesive layer 21 during a bending process. In addition, the first adhesive layer 21 can also be divided into multiple regions with different thicknesses. In other words, during specific implementation, a structure of the first adhesive layer 21 can be adjusted according to a specific structure of the non-display area 12 or the display panel 10.

As shown in FIG. 3 and FIG. 4, the second adhesive layer 22 is located on a side of the first adhesive layer 21 away from the display area 11 and connected to the first adhesive layer 21. In other words, the second adhesive layer 22 is located in the second extension portion 123 and connected to the first adhesive layer 21.

Obviously, the present application can increase the stiffness of the non-display area 12 by completing the arrangement of the second adhesive layer 22 before a bending process of the non-display area. In this way, both sides and a middle area of the non-display area 12 can move synchronously during the bending process, and there is no stress concentration point caused by a local rebound. Therefore, the problem of cracks on both sides of the non-display area can also be solved, and product reliability can be improved. In addition, the first adhesive layer 21 can also be configured to protect the non-display area 12 of the display panel 10 from being scratched or worn, thereby prolonging the service life of the display panel 10 and improving the quality of the display device and the display panel.

In a specific implementation, an end of the second adhesive layer 22 facing the display area 11 is connected to the first adhesive layer 21, or the second adhesive layer 22 covers a partial area of the first adhesive layer 21.

In a specific implementation, the material of the second adhesive layer 22 is polyimide (PI) or a tape. For example, in this embodiment, the second adhesive layer 22 is polyethylene terephthalate (PET).

In addition, the second adhesive layer 22 can also be configured to protect the non-display area 12 of the display panel 10 from being scratched or worn, thereby prolonging the service life of the display panel 10 and improving the quality of the display device and the display panel.

Obviously, this application increases the stiffness and strength of the two ends of the non-display area 12 by adjusting the extension area of the first adhesive layer 21 to connect the first adhesive layer 21 and the second adhesive layer 22. In this way, the protection range of circuits or metal wiring of the non-display area 12 is increased, and the protective effect is improved. Therefore, the problem of cracks on both sides of the non-display area 12 can be relieved, and product reliability can be improved.

As shown in FIG. 3 and FIG. 4, the display panel further includes a polarizing layer 30, and the polarizing layer 30 is disposed on a surface of a light-emitting side of the display panel 10. The polarizing layer 30 at least covers the display area 11 and is connected to the first adhesive layer 21.

Specifically, the polarizing layer 30 extends from the display area 11 to the non-display area 12 and is connected to the first adhesive layer 21.

As shown in FIG. 3 and FIG. 4, in this embodiment, the polarizing layer 30, the first adhesive layer 21, and the second adhesive layer 22 are sequentially connected along a direction from the display area 11 toward the non-display area 12 on a surface of a light-emitting side of the display panel 10.

In a specific implementation, the polarizing layer 30 can be a single-layer polarizing layer structure or can be a multi-layer laminated structure. It should be emphasized that the present application does not limit the structure or material of the polarizing layer 30.

As shown in FIG. 3 and FIG. 4, a backplate 50 is provided on a surface of a non-light emitting side of the display panel 10. The backplate 50 is provided with a hollow area that exposes a bendable portion 122 of the display panel 10.

With such an arrangement, the non-display area 12 can be bent and maintained according to a preset bending track and bending shape by providing the backplate 50. In addition, the hollow area will not affect the bending performance of the bendable portion 122, and also will not affect the bending process of the terminal area.

In a preferred embodiment, the backplate 50 covers an area of the display panel 10 except the bendable portion 122 to provide support and protection for the display panel 10. That is, when the non-display area 12 is unfolded, an orthographic projection of the bendable portion 122 on the backplate 50 falls within the hollow area, as shown in FIG. 3.

As a preferred embodiment, when the non-display area 12 is unfolded, an orthographic projection of the hollow area on the display panel 10 falls within the first adhesive layer 21, as shown in FIG. 3.

Please continue to refer to FIG. 3 and FIG. 4. In this embodiment, the backplate 50 includes a first backplate 51 and a second backplate 52. The first backplate 51 covers the display area 11 and the first extension portion 121, and the second backplate 52 is located in the second extension portion 123.

Specifically, the backplate 50 can be made of glass or polyimide (PI), or other materials, which are not limited in the embodiment of the present application.

Similarly, the present application does not limit the structure, size, thickness, or extension manner of the backplate 50. For example, according to an actual structure of the display panel, a heat dissipation pattern, a supporting structure, or a stress relief structure can be provided, which is not specifically limited in the embodiment of the present application.

As shown in FIG. 3, at least one driving chip 40 is bonded to a surface of a light-emitting side of the display panel 10, and the driving chip 40 is located on a side of the second adhesive layer 22 away from the display area 11.

In other words, on a surface of the light-emitting side of the display panel 10, the polarizing layer 30, the first adhesive layer 21, the second adhesive layer 22, and the driving chip 40 are arranged in sequence along a direction of the display area 11 toward the non-display area 12.

In a specific implementation, the driving chip 40 is bonded or electrically connected to a bonding pad exposed on a surface of the second extension portion 123. This solution can simultaneously correspond to a chip on film (COF) process and a chip on panel (COP) process.

The display panel 10 described in the present application improves the stiffness of both sides of non-display area 12 through the cooperation of a backplate 50, a polarizing layer 30, a second adhesive layer 22, and a first adhesive layer 21, so that stress concentration points caused by local rebound during a bending process will not be formed on the non-display area 12. It also improves the supporting effect of the non-display area 12 and the protective effect of the circuits or wiring in the non-display area 12, thereby relieving the problem of cracks on both sides of the non-display area 12 and improving product reliability.

Figure 5:
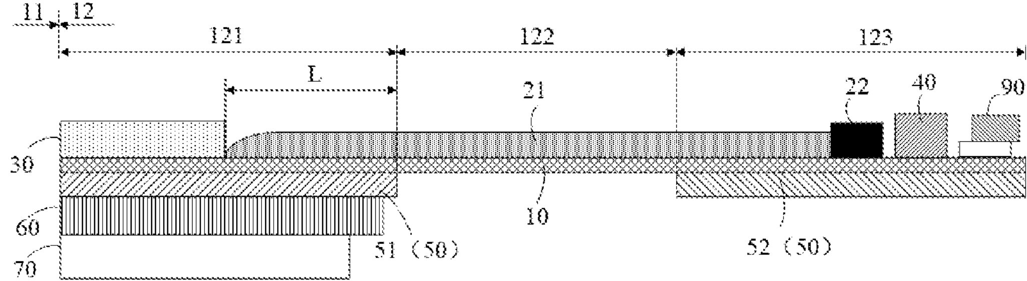
FIG. 5 is a schematic diagram of an unfolded state of a flexible display device according to the present application.
Figure 6:
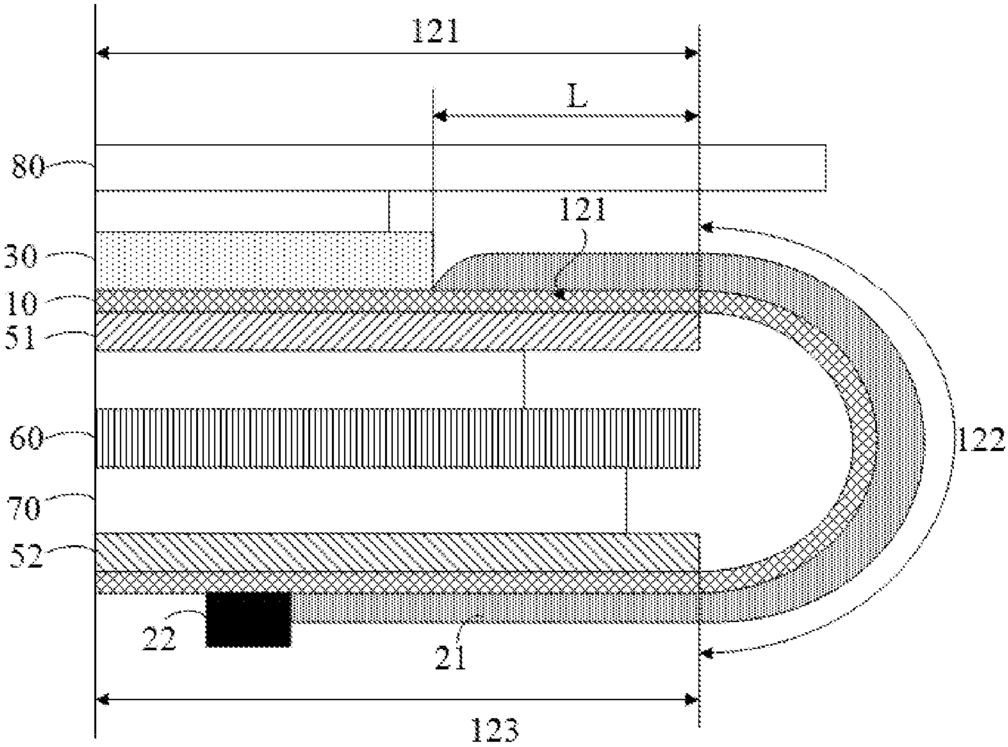
FIG. 6 is a schematic diagram of a bending state of the flexible display device according to the present application.

FIG. 5 is a schematic diagram of an unfolded state of a flexible display device of this application, and FIG. 6 is a schematic diagram of a bending state of the flexible display device of this application. As shown in FIG. 5 and FIG. 6, the present application provides a flexible display device, which includes a display panel 10, a supporting backplate 60, a filling gasket 70, a cover plate 80, and a printed circuit board 90.

The display panel 10 is the display panel described in this application, and for its specific structure, please refer to the above, which will not be repeated herein.

As shown in FIG. 5 and FIG. 6, a cover plate 80 is provided on a side of the polarizing layer 30 away from the display panel 10, and the cover plate 80 extends from the display area 11 to the non-display area 12. Moreover, when the non-display area 12 is bent to a non-light emitting side of the display panel 10 by the bendable portion 122, an orthographic projection of the cover plate 80 on the display panel 10 covers the entire display panel 10.

In a specific implementation, the cover plate 80 includes a flexible substrate and a hardened film layer laminated on one side of the flexible substrate. The flexible substrate may be a polymer material such as polyimide (PI), cyclo olefin polymer (COP), or polyethylene terephthalate (PET), and its thickness generally does not exceed 50 μm to ensure that the flexible cover plate has better bending characteristics. The hardened thin film layer is a thin film structure deposited on one surface of the flexible substrate, and its thickness generally does not exceed 10 μm. The strength of the flexible cover plate can be enhanced by the hardened film layer, and the characteristics of the flexible cover plate such as drop resistance, wear resistance, and water resistance can be realized. As shown in FIG. 5 and FIG. 6, an optical adhesive layer is provided on a side of the polarizing layer 30 away from the display panel 10 for bonding the cover plate 80 and the polarizing layer 30. In a specific implementation, the material of the optical adhesive layer may be optically clear adhesive (OCA). OCA is a special adhesive used to bond transparent optical components. It has the advantages of colorless and transparent, light transmittance above 90%, good bonding strength, etc., and has viscoelasticity.

As shown in FIG. 5 and FIG. 6, the supporting backplate 60 is disposed on a side of the backplate 50 away from the display panel 10, and the supporting backplate 60 covers the display area 11 and extends into the first extension portion 121.

Please refer to FIG. 6, when the non-display area 12 is in a bending state, the supporting backplate 60 is located between the first backplate 51 and the second backplate 52.

In a specific implementation, the material of the supporting backplate 60 is stainless steel (SUS). In other embodiments, the supporting backplate 60 can also be a glass material or PI, or other materials, which is not limited in the embodiment of the present application.

As shown in FIG. 5 and FIG. 6, a foam adhesive layer (foam) is provided between the backplate 50 and the supporting backplate 60. The foam adhesive layer is configured to bond the supporting backplate 60 and the backplate 50.

As shown in FIG. 5 and FIG. 6, a filling gasket 70 is further provided on a side of the supporting backplate 60 away from the display panel 10, and the filling gasket 70 is disposed on a side of the supporting backplate 60 away from the display panel 10.

Please refer to FIG. 6, when the non-display area 12 is in a bending state, the filling gasket 70 is located on a side of the supporting backplate 60 facing the second backplate 52, and two opposite surfaces of the filling gasket 70 in a thickness direction are in contact with the supporting backplate 60 and the second backplate 52, respectively.

The filling gasket 70 is provided to provide stable support for the display area 11 and the non-display area 12, respectively. On the one hand, it can prevent the hanging state between the display area 11 and the second extension portion 123, which reduces the impact resistance of the display panel 10. Thus, the metal wires on the non-display area 12 are not prone to breakage. On the other hand, it can also prevent or reduce a shift or misalignment of edges of the display panel.

As mentioned above, the filling gasket 70 can keep the pad bending process in the display panel 10 in a good bending track and bending shape. It is beneficial to reduce the multi-directional tensile stress caused by the curved area and improve the yield of the display panel.

In a specific implementation, the material of the filling gasket 70 is at least one of silica gel, polyimide, polypropylene, or polymethyl methacrylate.

As shown in FIG. 5 and FIG. 6, a printed circuit board 90 is provided on a surface of a light-emitting side of the display panel 10. The printed circuit board 90 is located on a side of the driving chip 40 away from the display area 11.

In a specific implementation, the printed circuit board 90 can be formed of a rigid printed circuit board material (for example, epoxy resin filled with glass fiber), a flexible sheet (such as a polymer), or a combination of a rigid material and a flexible material (rigid-flex printed circuit board). The flexible printed circuit board (flexible circuit board) can be formed of a flexible polyimide sheet, for example.

The application further provides a manufacturing method of a flexible display panel. The manufacturing method of the flexible display panel includes following steps:

S0: Providing a display panel, where the display panel includes a display area and a non-display area located at a periphery of the display area, and the non-display area is provided with a bendable portion. S1: The step of bonding a driving chip, where the driving chip is disposed on a surface of a light-emitting side of the display panel and is located in the non-display area of the surface of the light-emitting side. S2: The step of bonding a printed circuit board, where the printed circuit board is located in the non-display area of the surface of the light-emitting side. S3: The step of forming a second adhesive layer, where the second adhesive layer is disposed on the surface of the light-emitting side, and the second adhesive layer is located on a side of the bendable portion away from the display area. S4: The step of forming a polarizing layer, where the polarizing layer is disposed on the surface of the light-emitting side of the display panel and covers at least the display area. S5: The step of forming a first adhesive layer, where the first adhesive layer is disposed on the non-display area of the surface of the light-emitting side, and the first adhesive layer covers the bendable portion and is connected to the second adhesive layer and the polarizing layer, respectively.

Specifically, in the step S5, the first adhesive layer 21 extends in a direction from the bendable portion 122 toward the display area 11 for a predetermined distance L. The predetermined distance L is greater than or equal to 550 um.

Specifically, the second adhesive layer 22 can be a PET layer, and the first adhesive layer 21 can be a UV adhesive. In a preferred embodiment, on the surface of the light-emitting side of the display panel 10, the polarizing layer 30, the first adhesive layer 21, the second adhesive layer 22, the driving chip 40, and the printed circuit board 90 are arranged in sequence.

In a specific implementation, the time point of attaching a second adhesive layer 22 in the non-display area 12 is advanced from the assembly station (after bending) to after the bonding station (before bending), and simultaneously apply the first adhesive layer directly to an edge of the second adhesive layer 22. In the manufacturing method of the flexible display device described in the present application, the second adhesive layer 22 is applied before the non-display area of the display panel 10 is bent by adjusting the production and the adhesive-coating process of the display panel. The first adhesive layer 21 can directly coat or even cover edges of the second adhesive layer 22 and the polarizing layer 30, thereby enhancing the protection of the circuits in the non-display area 12. It can also improve the stiffness of the non-display area 12, and prevent both sides of the non-display area 12 from being unable to move synchronously with the middle area in the subsequent non-display area bending process, which causes local stress concentration and leads to circuit crack. Thus, the reliability of the display panel is improved.

The flexible display panel and the display device provided by the embodiments of the present application are described in detail above. Specific embodiments are used in this article to describe the principles and implementation of the application, and the description of the above embodiments is only used to help understand the technical solutions and core ideas of the application. Those of ordinary skill in the art should understand that they can modify the technical solutions described in the embodiments, or equivalently replace some of the technical features. These modifications or replacements do not cause the essence of the corresponding technical solutions to deviate from the scope of the technical solutions of the embodiments of the present application.

What is claimed is:

1. A display device, comprising a flexible display panel, a supporting backplate, a first backplate, a second backplate, and a filling gasket;

wherein the flexible display panel comprises a display area and a non-display area located at a periphery of the display area, the non-display area comprises a first extension portion, a bendable portion, and a second extension portion sequentially connected in a direction away from the display area, a first adhesive layer and a second adhesive layer are provided on a light-emitting side of the flexible display panel, and the first adhesive layer and the second adhesive layer are both located in the non-display area; the first adhesive layer is configured to cover the bendable portion and extend along a direction from the bendable portion toward the display area, and the second adhesive layer is located on a side of the first adhesive layer away from the display area and connected to the first adhesive layer;

wherein the supporting backplate is provided on a non-light emitting side of the flexible display panel and is configured to at least cover the display area of the flexible display panel;

wherein the first backplate is configured to cover the display area and the first extension portion;

wherein the second backplate is located in the second extension portion;

wherein the filling gasket is disposed on a side of the supporting backplate away from the flexible display panel, so that in response to the non-display area being in a bending state, the filling gasket is located on a side of the supporting backplate facing the second backplate, and two opposite surfaces of the filling gasket in a thickness direction are in contact with the supporting backplate and the second backplate, respectively; and wherein a foam adhesive layer is provided between at least one of the first backplate and the second backplate as well as the supporting backplate.

2. The display device according to claim 1, wherein when the non-display area is bent to the non-light emitting side of the flexible display panel through the bendable portion, and the supporting backplate is disposed between the first backplate and the second backplate.

3. The display device according to claim 1, wherein a polarizing layer is provided on the light-emitting side of the flexible display panel, and the polarizing layer is configured to at least cover the display area.

4. The display device according to claim 3, wherein a predetermined distance between a point of the polarizing layer closest to the bendable portion and a point of the bendable portion closest to the polarizing layer is provided along a direction from the display area toward the non-display area, and the predetermined distance is greater than or equal to 550 μm.

5. The display device according to claim 3, wherein the first adhesive layer is connected to the polarizing layer and is configured to extend in a direction away from the display area.

6. The display device according to claim 3, wherein at least one driving chip is bonded to the light-emitting side of the flexible display panel, and the driving chip is located on a side of the second adhesive layer away from the display area.

7. The display device according to claim 6, wherein on the light-emitting side of the flexible display panel, the polarizing layer, the first adhesive layer, the second adhesive layer, and the driving chip are arranged in sequence along a direction from the display area toward the non-display area.

8. The display device according to claim 6, wherein a printed circuit board is provided on the light-emitting side of the flexible display panel, and the printed circuit board is located on a side of the driving chip away from the display area.

9. The display device according to claim 3, wherein an optical adhesive layer is provided on a side of the polarizing layer away from the flexible display panel.

10. The display device according to claim 3, further comprising a cover plate provided on a side of the polarizing layer away from the flexible display panel, wherein the cover plate is configured to cover at least the display area of the flexible display panel.

11. The display device according to claim 1, wherein a material of the filling gasket is at least one of silica gel, polyimide, polypropylene, and polymethyl methacrylate.

12. The display device according to claim 1, wherein the first adhesive layer is a UV adhesive.

13. The display device according to claim 1, wherein the second adhesive layer is a polyethylene terephthalate layer.

14. The display device according to claim 10, wherein the cover plate comprises a flexible substrate and a hardened film layer laminated on one side of the flexible substrate.

15. The display device according to claim 14, wherein the flexible substrate is a polymer material of polyimide, cyclo olefin polymer, or polyethylene terephthalate.

16. The display device according to claim 14, wherein a thickness of the flexible substrate is no greater than 50 μm.

17. The display device according to claim 14, wherein the hardened film layer is a film structure deposited on one surface of the flexible substrate, and a thickness of the hardened film layer is no greater than 10 μm.

* * * * *